United States Patent
Oberhauser

(10) Patent No.: US 7,353,126 B1
(45) Date of Patent: Apr. 1, 2008

(54) METHOD OF DETERMINING COHERENT TEST CONDITIONS

(75) Inventor: Chris Oberhauser, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/018,649

(22) Filed: Dec. 20, 2004

(51) Int. Cl.
*G01R 23/00* (2006.01)
*G06F 19/00* (2006.01)

(52) U.S. Cl. ........................................ 702/75; 341/123
(58) Field of Classification Search .................. 702/69, 702/70, 71, 74, 75, 190; 324/76.39, 307, 324/76.15; 385/116; 341/123; 375/147

See application file for complete search history.

(56) References Cited

U.S. PATENT DOCUMENTS 5,708,432 A * 1/1998 Reynolds et al. ........... 341/123

OTHER PUBLICATIONS

Matthew Mahoney, "DSP-Based Testing of Analog and Mixed-Signal Circuits", pp. 17-31 (Accuracy and Speed of Emulated Instruments), published in 1987 by the Computer Society Press).*

* cited by examiner

*Primary Examiner*—John Barlow
*Assistant Examiner*—John Le

(57) ABSTRACT

A method of determining coherent test conditions is disclosed. The method includes receiving constraints from a user, wherein the constraints include desired test conditions, desired tolerances for the desired test conditions, and desired instrument. Further, the method includes determining the coherent test conditions using the constraints. Moreover, the method includes providing each determined coherent test condition to the user, wherein each determined coherent test condition includes a calculated sampling frequency and a calculated analog frequency.

19 Claims, 4 Drawing Sheets

METHOD OF DETERMINING COHERENT TEST CONDITIONS

CROSS REFERENCE TO RELATED APPLICATION

The U.S. patent application Ser. No. 11/018,713, filed Dec. 20, 2004, entitled "METHOD OF ENABLING A USER TO GRAPHICALLY INTERFACE WITH AN APPLICATION FOR CALCULATING COHERENT TEST CONDITIONS", by Jeff Coleman, assigned to the same assignee of the present patent application, is hereby incorporated by reference.

BACKGROUND OF THE INVENTION

1. Field of the Invention

Embodiments of the present invention generally relate to testing a device and automated testing equipment (ATE). More particularly, embodiments of the present invention relate to determining coherent test conditions.

2. Related Art

Measurement of several characteristics of a device (e.g., an electronic device) is commonly performed by measuring the response of the device to an analog sinewave input. Examples of these characteristics include Signal-to-Noise Ratio (SNR), Total Harmonic Distortion (THD), Spurious Free Dynamic Range (SFDR), and Signal-to Noise and Distortion Ratio (SINAD).

This analysis of the device's response typically involves the use of the Discrete Fourier Transform (DFT) or variants of the DFT such as Fast Fourier Transform (FFT) and Chirp-Z Transform may be used due to their computational time advantages.

A measurement set-up configured to meet a coherency requirement provides an efficient manner of analyzing the device. Typically, laborious manual calculations are performed to determine the coherency test conditions, which are test conditions that meet the coherency requirement. Further, these calculations may lead to incorrect coherency test conditions that waste time and resources.

Conventional automated techniques for determining the coherency test conditions have several deficiencies. These conventional automated techniques are very limited. They impose limitations that limit or remove from consideration coherency test conditions that may actually be desired by the user. Further, these conventional automated techniques provide no flexibility in the coherency test conditions to conform to constraints submitted by the user. Moreover, they restrict the determination of the coherency test conditions to coherency test conditions that are useable only by specific instrument that generates or captures analog signals, preventing the user from using other instruments that generate or capture analog signals in the measurement set-up.

SUMMARY OF THE INVENTION

A method of determining coherent test conditions is disclosed. The method includes receiving constraints from a user, wherein the constraints include desired test conditions, desired tolerances for the desired test conditions, and desired instrument. Further, the method includes determining the coherent test conditions using the constraints. Moreover, the method includes providing each determined coherent test condition to the user, wherein each determined coherent test condition includes a calculated sampling frequency and a calculated analog frequency.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

In an embodiment, a method of determining coherent test conditions is disclosed. This method efficiently finds the coherent test conditions. Further, coherent test conditions that meet constraints submitted by user are determined.

In a measurement set-up, an instrument is programmed with the coherent test condition(s). The instrument may be used to generate an analog signal, capture the analog signal, or both generate and capture the analog signal. Depending on the capacity of the instrument, more than one analog signal may be generated or captured. The coherent test condition enables the instrument to perform a coherent generation or a coherent capture. That is, each sample provides unique information about the shape of the analog signal being generated or captured. A coherent test condition is a test condition that meets the coherency requirement in Equation 1 (Eq. 1).

$$M/N = F_a/F_s \quad \text{(Eq. 1)}$$

$F_a$ is the analog frequency of an analog sinewave while $F_s$ is the sampling frequency of the instrument. Furthermore, M is the integer number of analog sinewave cycles captured or generated in a coherent manner. N is the integer number of samples captures or generated by the instrument. The coherency requirement is simply that the values of M and N from Equation 1 must have no common integer factors, excluding the factor 1.

Figure 1:
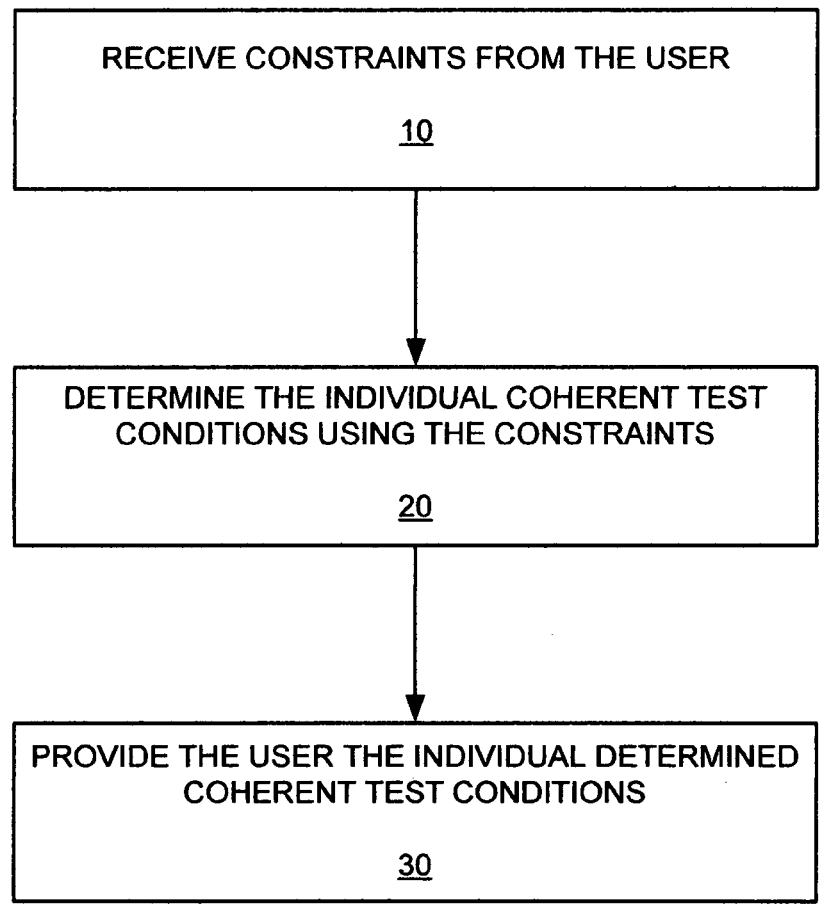
FIG. 1 illustrates a flowchart showing a method of determining coherent test conditions in accordance with an embodiment of the present invention.

FIG. 1 illustrates a flowchart showing a method 100 of determining coherent test conditions in accordance with an embodiment of the present invention. In an embodiment, the present invention is implemented as computer-executable instructions for performing this method 100. The computer-executable instructions can be stored in any type of computer-readable medium, such as a magnetic disk, CD-ROM, an optical medium, a floppy disk, a flexible disk, a hard disk, a magnetic tape, a RAM, a ROM, a PROM, an EPROM, a flash-EPROM, or any other medium from which a computer can read.

At Step 10, constraints are received from the user. Examples of constraints include specific desired test conditions such as desired analog frequency and desired sampling frequency. Other constraints include desired tolerance for the desired analog frequency and desired tolerance for the desired sampling frequency. Further, the desired instrument (which is responsible for the sampling frequency) is another constraint submitted by the user. Thus, the user has flexibility to choose any one of a number of instruments. As will be discussed below, instrument constraints are associated with each instrument.

Moreover, the user may specify the desired minimum number and the desired maximum number of samples ($N_{min}$ and $N_{max}$, respectively). Generally, setting N larger leads to coherent test conditions that closer satisfy the constraints submitted by the user, and lead to better repeatability of results. The trade-offs are longer test time and larger storage memory. Also, the user may specify a value for the maximum number of individual coherent test conditions to be determined. Generally, setting this value larger increases the processing time required to determine the desired number of individual coherent test conditions.

Figure 2A:
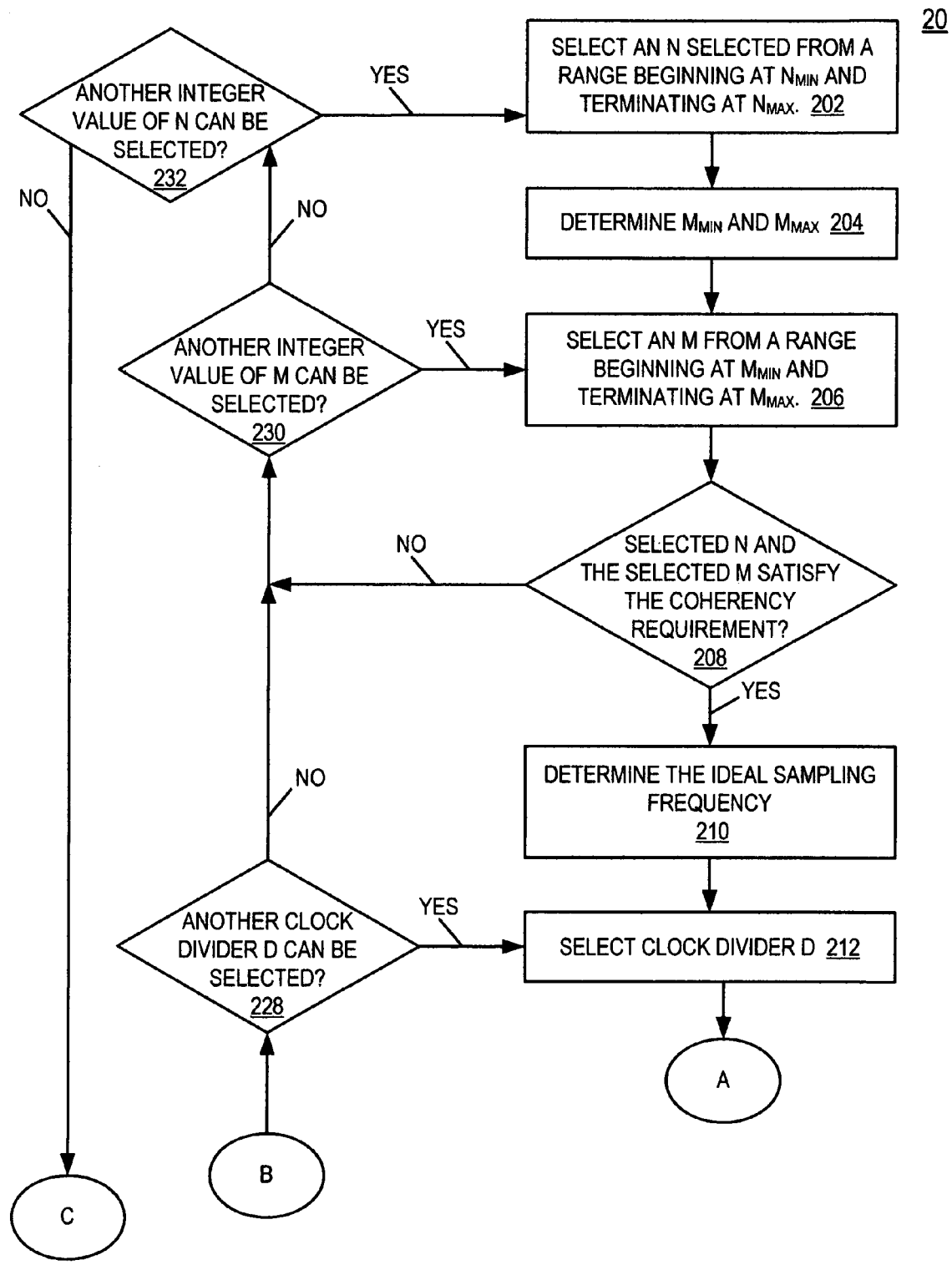
FIGS. 2A and 2B illustrate a flow chart showing determination of the coherent test conditions using the constraints of FIG. 1 in accordance with an embodiment of the present invention.
Figure 2B:
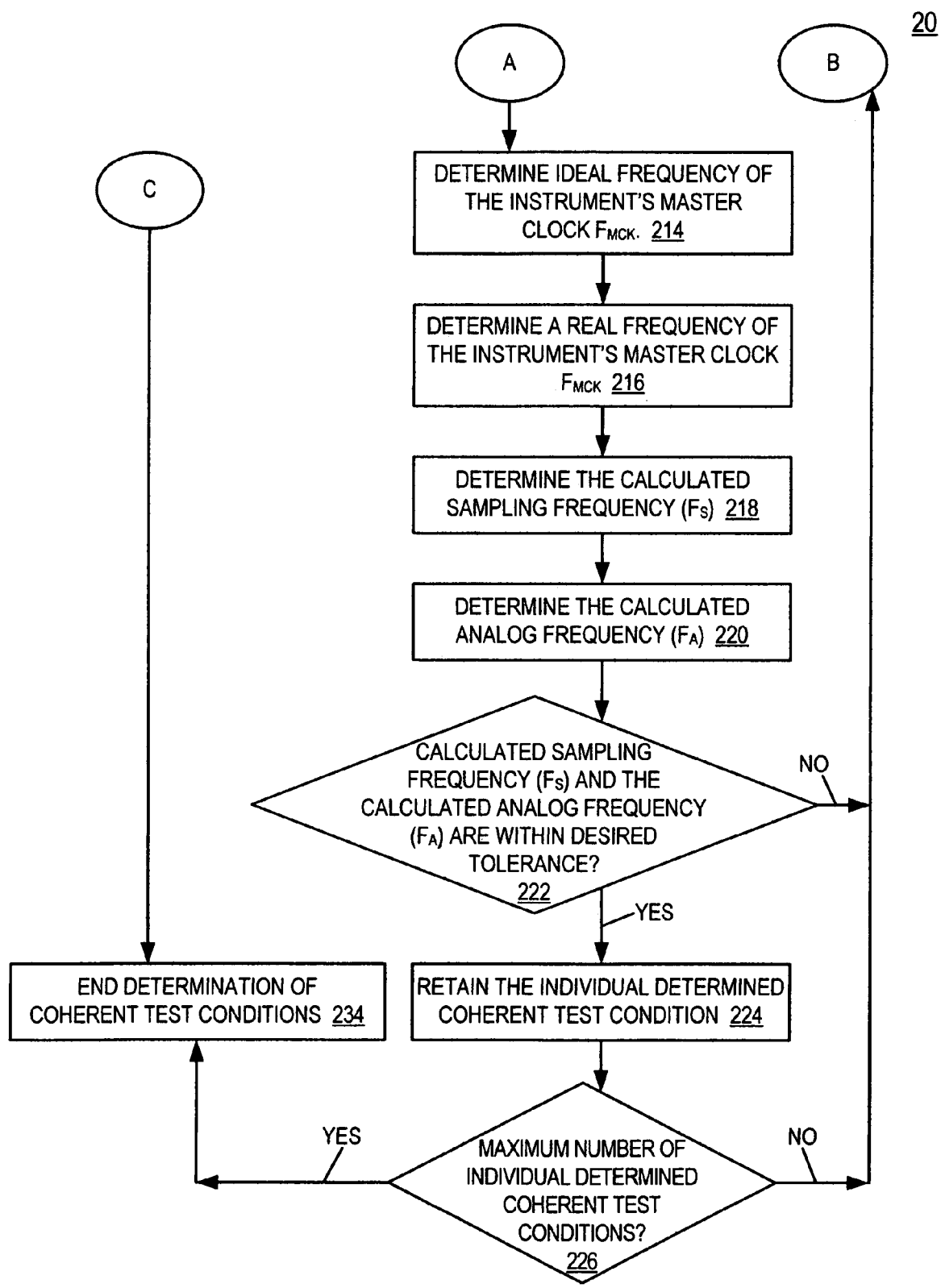

Continuing with FIG. 1, at Step 20, the individual coherent test conditions are determined using the constraints described above. FIGS. 2A and 2B describe Step 20 in greater detail. At Step 30, the user is provided individual determined coherent test conditions, wherein each determined coherent test condition includes a calculated sampling frequency ($F_s$ in Equation 1) and a calculated analog frequency ($F_a$ in Equation 1). The number of individual determined coherent test conditions is dependent on the value for the maximum number of individual coherent test conditions to be determined.

FIGS. 2A and 2B illustrate a flow chart 20 showing determination of the coherent test conditions using the constraints of FIG. 1 in accordance with an embodiment of the present invention. In particular, FIGS. 2A and 2B describe the Step 20 of FIG. 1 in greater detail. In an embodiment, the present invention is implemented as computer-executable instructions for performing aspects of the present invention illustrated with the flow chart 20. The computer-executable instructions can be stored in any type of computer-readable medium, such as a magnetic disk, CD-ROM, an optical medium, a floppy disk, a flexible disk, a hard disk, a magnetic tape, a RAM, a ROM, a PROM, an EPROM, a flash-EPROM, or any other medium from which a computer can read.

Referring to FIG. 2A, at Step 202, an N (which is the integer number of samples captured or generated by the instrument) is selected from a range beginning at $N_{min}$ and terminating at $N_{max}$. In an embodiment, $N_{min}$ is selected first. At Step 204, $M_{min}$ and $M_{max}$ are determined. As described above, M is the integer number of analog sinewave cycles captured or generated in a coherent manner. This determination uses Equation 1, the desired analog frequency, the desired sampling frequency, and the selected N from Step 202. Further, the desired tolerance for the desired analog frequency and desired tolerance for the desired sampling frequency are also utilized to determine $M_{min}$ and $M_{max}$. In determining $M_{max}$, the instrument type (e.g., instrument for generating analog signals or instrument for capturing analog signals) affects the possible value of $M_{max}$. That is, if the instrument type is a generator, then the $M_{max}$ is less than N/2. However, if the instrument is a digitizer, the value of $M_{max}$ is normally less than N/2, but can also be allowed to exceed N to search for undersampling.

Continuing, at Step 206, an M (which the integer number of analog sinewave cycles captured or generated in a coherent manner) is selected from a range beginning at $M_{min}$ and terminating at $M_{max}$. In an embodiment, $M_{min}$ is selected first. At Step 208, it is determined whether the selected N from Step 202 and the selected M from Step 206 satisfy the coherency requirement, where the values of M and N must have no common integer factors, excluding the factor 1. If the selected N from Step 202 and the selected M from Step 206 do not satisfy the coherency requirement, at Step 230 it is determined whether there is another integer value of M that can be selected from the range beginning at $M_{min}$ and terminating at $M_{max}$. If there is another integer value of M that can be selected from the range beginning at $M_{min}$ and terminating at $M_{max}$, at Step 206 another M is selected. Otherwise, at Step 232 it is determined whether there is another integer value of N that can be selected from the range beginning at $N_{min}$ and terminating at $N_{max}$. If there is another integer value of N that can be selected from the range beginning at $N_{min}$ and terminating at $N_{max}$, at Step 202 another N is selected. Otherwise, at Step 234 the determination of coherent test conditions is ended.

As described above, at Step 208 it is determined whether the selected N from Step 202 and the selected M from Step 206 satisfy the coherency requirement. If the selected N from Step 202 and the selected M from Step 206 satisfy the coherency requirement, at Step 210 the ideal sampling frequency is determined. This determination utilizes Equation 1, the desired analog frequency for $F_a$, the selected N from Step 202, and the selected M from Step 206. In an embodiment, a range of ideal sampling frequencies is determined if the desired tolerance for the desired analog frequency is utilized.

At Step 212, a clock divider D is selected. The number of clock dividers D is dependent on the desired instrument and is an instrument constraint. For example, a particular instrument may have 1 as the sole clock divider D while another instrument may have a range beginning at $D_{min}$ and terminating at $D_{max}$. The clock divider D is utilized as depicted in Equation 2 (Eq. 2).

$$F_{MCK}/D=F_s \quad\quad (Eq.\ 2)$$

$F_{MCK}$ is the frequency of the instrument's master clock while $F_s$ is the sampling frequency of the instrument. The instrument's master clock may be a fixed frequency, or adjustable with a specific relationship between realizable frequencies (e.g., the master clock can be set from 100 MHz to 200 MHz in 10 Hz increments). The realizable settings of the master clock are dependent on the desired instrument and are functionally an instrument constraint. Furthermore, D is the clock divider.

Moreover, at Step 214, the ideal frequency of the instrument's master clock $F_{MCK}$ is determined using Equation 2, the ideal sampling frequency from Step 210 for ($F_s$), and the selected clock divider D from Step 212. At Step 216, a real frequency of the instrument's master clock $F_{MCK}$ is determined by calculating the closest master clock frequency $F_{MCK}$ that may be produced by the desired instrument submitted by the user. Then, at Step 218, the calculated sampling frequency ($F_s$) is determined using Equation 2, the real frequency of the instruments master clock $F_{MCK}$ from Step 216, and the selected clock divider D from Step 212. Further, at Step 220, the calculated analog frequency ($F_a$) is determined. This determination utilizes Equation 1, the calculated sampling frequency ($F_s$) from Step 218, the selected N from Step 202, and the selected M from Step 206.

At Step 222, it is determined whether the calculated sampling frequency ($F_s$) from Step 218 and the calculated analog frequency ($F_a$) from Step 220 are within the desired tolerance for the desired analog frequency and within the desired tolerance for the desired sampling frequency, respectively. If both the calculated sampling frequency ($F_s$) from Step 218 and the calculated analog frequency ($F_a$) from Step 220 are within the desired tolerances, at Step 224 the calculated sampling frequency ($F_s$) from Step 218, the calculated analog frequency ($F_a$) from Step 220, the selected N from Step 202, and the selected M from Step 206 are retained and form an individual determined coherent test condition.

Otherwise, the calculated sampling frequency ($F_s$) from Step 218 and the calculated analog frequency ($F_a$) from Step 220 are discarded. At Step 228, it is determined whether there is another clock divider D that can be selected. If there is another clock divider D that can be selected, at Step 212 another clock divider D is selected. If there is no other clock divider D that can be selected, at Step 230 it is determined whether there is another integer value of M that can be selected from the range beginning at $M_{min}$ and terminating at $M_{max}$.

As described above, at Step 224 the individual determined coherent test condition is retained. Further, at Step 226, it is determined whether number of individual determined coherent test conditions equals the desired number of determined coherent test conditions submitted by the user. If the number of individual determined coherent test conditions equals the desired number of determined coherent test conditions submitted by the user, at Step 234 the determination of coherent test conditions is ended. Otherwise, at Step 228, it is determined whether there is another clock divider D that can be selected, as explained above.

Figure 3:
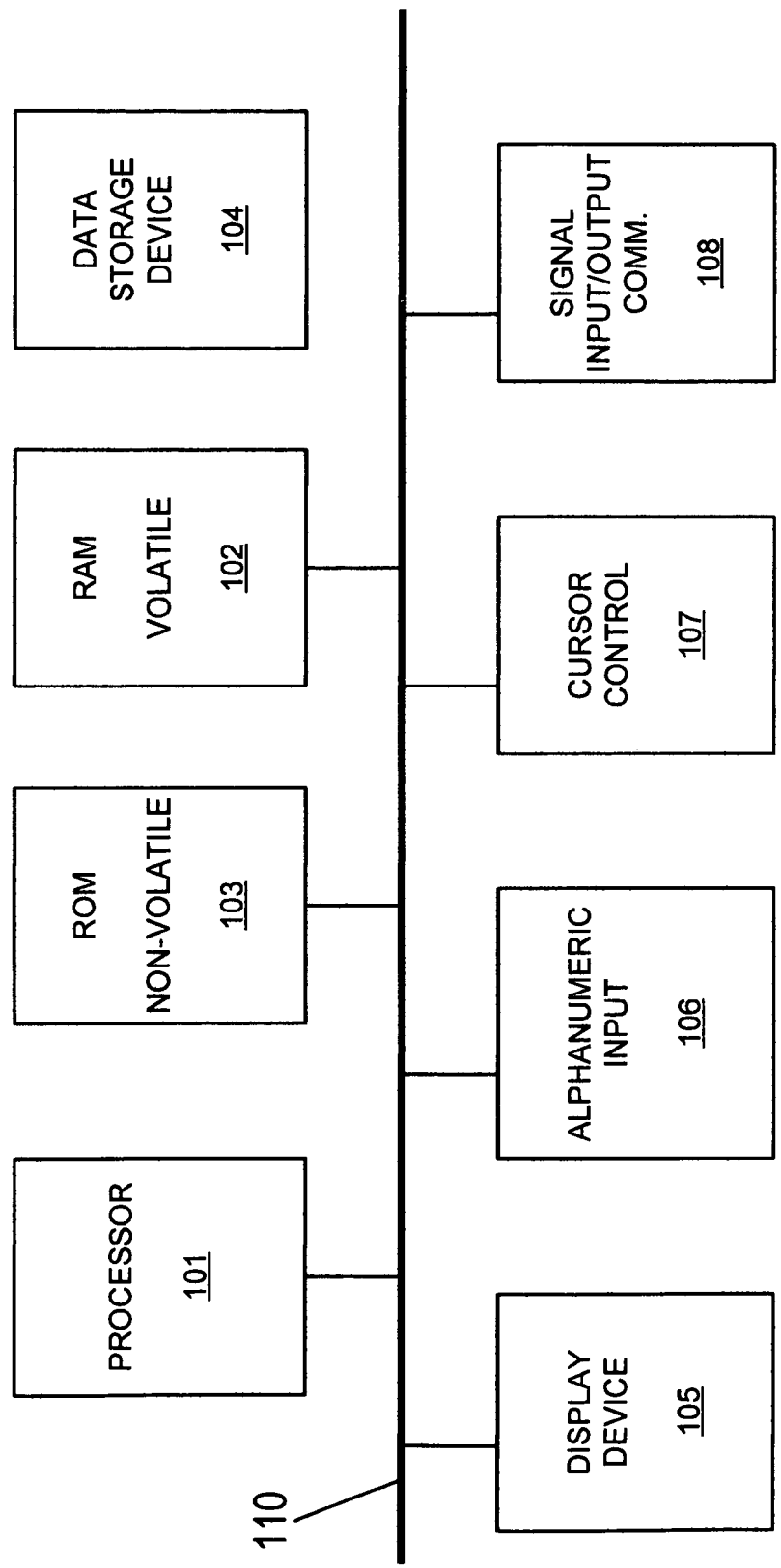
FIG. 3 illustrates an exemplary computer system on which embodiments of the present invention may be practiced.

FIG. 3 illustrates an exemplary computer system 300 on which embodiments of the present invention may be practiced. Aspects of the present invention can be implemented or executed on a computer system or any other computational system. Although a variety of different computer systems can be used with the present invention, an exemplary computer system 300 is shown in FIG. 3.

With reference to FIG. 3, portions of the present invention are comprised of computer-readable and computer executable instructions which reside, for example, in computer-usable media of an electronic system such as the exemplary computer system 300. FIG. 3 illustrates an exemplary computer system 300 on which embodiments of the present invention may be practiced. It is appreciated that the computer system 300 of FIG. 3 is exemplary only and that the present invention can operate within a number of different computer systems including general-purpose computer systems and embedded computer systems.

Computer system 300 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 300 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes) which are computer-readable memories. Memory units of computer system 300 include volatile memory 102, non-volatile memory 103 and data storage device 104.

Exemplary computer system 300 can further include a signal input/output communication device 108 (e.g., a network interface card "NIC") coupled to the bus 110 for interfacing with other computer systems. Also included in exemplary computer system 300 of FIG. 3 is an alphanumeric input device 106 including alphanumeric and function keys coupled to the bus 110 for communicating information and command selections to the central processor 101. Exemplary computer system 300 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of determining coherent test conditions, said method comprising:

receiving constraints from a user, wherein said constraints include desired test conditions, desired tolerances for said desired test conditions, and desired instrument;

determining said coherent test conditions using said constraints, wherein said determining said coherent test conditions includes determining a calculated sampling frequency and a calculated analog frequency; and providing each determined coherent test condition to said user, wherein each determined coherent test condition includes said calculated sampling frequency and said calculated analog frequency, wherein said constraints include a first range of desired number of samples, wherein said desired conditions include a desired sampling frequency and a desired analog frequency, and wherein said determining said coherent test conditions comprises:

selecting a sample value from said first range;

determining a second range of integer number of cycles for coherency using said sample value, said desired sampling frequency, and said desired analog frequency;

selecting an integer value from said second range;

if said selected sample value and said selected integer value satisfy requirement for coherency, determining an ideal sampling frequency using said selected sample value, said selected integer value, and said desired sampling frequency;

using a clock divider value and said ideal sampling frequency to determine said calculated sampling frequency and said calculated analog frequency; and retaining said calculated sampling frequency and said calculated analog frequency if fall within desired tolerances.

2. The method as recited in claim 1 wherein said using a clock divider value comprises:

selecting a clock divider value based on said desired instrument;

determining an ideal master clock frequency using said ideal sampling frequency and said selected clock divider;

determining a real master clock frequency using said ideal master clock frequency;

determining said calculated sampling frequency using said real master clock frequency and said selected clock divider; and determining said calculated analog frequency using said selected sample value, said selected integer value, and said calculated sampling frequency.

3. The method as recited in claim 2 further comprising replacing said selected clock divider value with another clock divider value if available.

4. The method as recited in claim 1 further comprising replacing said selected integer value with another integer value if available.

5. The method as recited in claim 1 further comprising replacing said selected sample value with another sample value if available.

6. The method as recited in claim 1 wherein said constraints include a desired number of determined coherent test conditions, and wherein said method further comprises:

ending said step of determining said coherent test conditions when number of determined coherent test conditions equals desired number of determined coherent test conditions.

7. The method as recited in claim 1 wherein said step of determining said coherent test conditions using said constraints includes:

using undersampling in one or more coherent test conditions associated with capturing an analog signal.

8. A computer-readable medium comprising computer-executable instructions stored therein for implementing a method of determining coherent test conditions, said method comprising:

receiving constraints from a user, wherein said constraints include desired test conditions, desired tolerances for said desired test conditions, and desired instrument;

determining said coherent test conditions using said constraints, wherein said determining said coherent test conditions includes determining a calculated sampling frequency and a calculated analog frequency; and providing each determined coherent test condition to said user, wherein each determined coherent test condition includes said calculated sampling frequency and said calculated analog frequency, wherein said constraints include a first range of desired number of samples, wherein said desired conditions include a desired sampling frequency and a desired analog frequency, and wherein said determining said coherent test conditions comprises:

selecting a sample value from said first range;

determining a second range of integer number of cycles for coherency using said sample value, said desired sampling frequency, and said desired analog frequency;

selecting an integer value from said second range;

if said selected sample value and said selected integer value satisfy requirement for coherency, determining an ideal sampling frequency using said selected sample value, said selected integer value, and said desired sampling frequency;

using a clock divider value and said ideal sampling frequency to determine said calculated sampling frequency and said calculated analog frequency; and retaining said calculated sampling frequency and said calculated analog frequency if fall within desired tolerances.

9. The computer-readable medium as recited in claim 8 wherein said using a clock divider value comprises:

selecting a clock divider value based on said desired instrument;

determining an ideal master clock frequency using said ideal sampling frequency and said selected clock divider;

determining a real master clock frequency using said ideal master clock frequency;

determining said calculated sampling frequency using said real master clock frequency and said selected clock divider; and determining said calculated analog frequency using said selected sample value, said selected integer value, and said calculated sampling frequency.

10. The computer-readable medium as recited in claim 9 wherein said method further comprises replacing said selected clock divider value with another clock divider value if available.

11. The computer-readable medium as recited in claim 8 wherein said method further comprises replacing said selected integer value with another integer value if available.

12. The computer-readable medium as recited in claim 8 wherein said method further comprises replacing said selected sample value with another sample value if available.

13. The computer-readable medium as recited in claim 8 wherein said constraints include a desired number of determined coherent test conditions, and wherein said method further comprises:

ending said step of determining said coherent test conditions when number of determined coherent test conditions equals desired number of determined coherent test conditions.

14. A system comprising:

a processor; and a memory unit comprising computer-executable instructions stored therein for implementing a method of determining coherent test conditions, said method comprising:

receiving constraints from a user, wherein said constraints include desired test conditions, desired tolerances for said desired test conditions, and desired instrument;

determining said coherent test conditions using said constraints, wherein said determining said coherent test conditions includes determining a calculated sampling frequency and a calculated analog frequency; and providing each determined coherent test condition to said user, wherein each determined coherent test condition includes said calculated sampling frequency and said calculated analog frequency, wherein said constraints include a first range of desired number of samples, wherein said desired conditions include a desired sampling frequency and a desired analog frequency, and wherein said determining said coherent test conditions comprises:

selecting a sample value from said first range;

determining a second range of integer number of cycles for coherency using said sample value, said desired sampling frequency, and said desired analog frequency;

selecting an integer value from said second range;

if said selected sample value and said selected integer value satisfy requirement for coherency, determining an ideal sampling frequency using said selected sample value, said selected integer value, and said desired sampling frequency;

using a clock divider value and said ideal sampling frequency to determine said calculated sampling frequency and said calculated analog frequency; and retaining said calculated sampling frequency and said calculated analog frequency if fall within desired tolerances.

15. The system as recited in claim 14 wherein said using a clock divider value comprises:

selecting a clock divider value based on said desired instrument;

determining an ideal master clock frequency using said ideal sampling frequency and said selected clock divider;

determining a real master clock frequency using said ideal master clock frequency;

determining said calculated sampling frequency using said real master clock frequency and said selected clock divider; and determining said calculated analog frequency using said selected sample value, said selected integer value, and said calculated sampling frequency.

16. The system as recited in claim 15 wherein said method further comprises replacing said selected clock divider value with another clock divider value if available.

17. The system as recited in claim 14 wherein said method further comprises replacing said selected integer value with another integer value if available.

18. The system as recited in claim 14 wherein said method further comprises replacing said selected sample value with another sample value if available.

19. The system as recited in claim 14 wherein said constraints include a desired number of determined coherent test conditions, and wherein said method further comprises:

ending said step of determining said coherent test conditions when number of determined coherent test conditions equals desired number of determined coherent test conditions.

* * * * *